(12) United States Patent
Mische et al.

(10) Patent No.: US 8,758,061 B2
(45) Date of Patent: Jun. 24, 2014

(54) SUPPLY MODULE AND DRIVE MODULE

(71) Applicant: Beckhoff Automation GmbH, Verl (DE)

(72) Inventors: Christian Mische, Bielefeld (DE); Markus Eickhoff-Gotza, Rheda-Wiedenbruck (DE); Frank Sieweke, Leopoldshohe (DE)

(73) Assignee: Beckhoff Automation, GmbH, Verl (DE)

( * ) Notice: Subject to any disclaimer, the term of this patent is extended or adjusted under 35 U.S.C. 154(b) by 13 days.

(21) Appl. No.: 13/654,127

(22) Filed: Oct. 17, 2012

(65) Prior Publication Data
US 2013/0040494 A1 Feb. 14, 2013

Related U.S. Application Data

(63) Continuation of application No. PCT/EP2011/055767, filed on Apr. 13, 2011.

(30) Foreign Application Priority Data

Apr. 19, 2010 (DE) .......................... 10 2010 027 901

(51) Int. Cl.
*H01R 13/68* (2011.01)
(52) U.S. Cl.
USPC .................................................... 439/620.26
(58) Field of Classification Search
CPC ..... H05K 1/0263; H05K 1/145; H01H 85/20; H01R 9/2458
USPC .............. 439/620.26, 620.27, 76.2, 251, 366, 439/516, 715; 361/628–630, 833, 837; 337/188, 216
See application file for complete search history.

(56) References Cited

U.S. PATENT DOCUMENTS

| | | | |
|---|---|---|---|
| 4,989,118 A | 1/1991 | Sorenson | |
| 5,148,139 A * | 9/1992 | Dingle et al. | ...................... 337/6 |
| 5,579,217 A | 11/1996 | Deam et al. | |
| 6,220,876 B1 * | 4/2001 | Avila et al. | ................... 439/76.2 |
| 6,743,027 B1 * | 6/2004 | Kowtun | ....................... 439/76.2 |
| 7,982,331 B2 * | 7/2011 | Murray et al. | ................. 307/9.1 |
| 2008/0268671 A1 | 10/2008 | Harris | |

FOREIGN PATENT DOCUMENTS

| | | |
|---|---|---|
| DE | 67 50 051 | 1/1969 |
| DE | 3423924 | 1/1986 |
| DE | 29719226 | 4/1999 |
| DE | 100 40 651 | 3/2002 |

(Continued)

OTHER PUBLICATIONS

UL Standard for Safety for Industrial Control Panels, UL 508A. 252 pages. Retrieved Jul. 23, 2008.

(Continued)

*Primary Examiner* — Edwin A. Leon
(74) *Attorney, Agent, or Firm* — Dorsey & Whitney, LLP

(57) ABSTRACT

A supply module for supplying electric current to a drive module includes a first connecting contact and a second connecting contact. The first connecting contact is configured to connect the supply module to the drive module. The second connecting contact is configured to provide a connection to a power supply. At least one fuse element is arranged between the first connecting contact and the second connecting contact, the fuse element being connected to the two connecting contacts and being configured to limit a current flow between the first connecting contact and the second connecting contact.

20 Claims, 8 Drawing Sheets

(56) References Cited

FOREIGN PATENT DOCUMENTS

| DE | 10325956 | 3/2004 |
|---|---|---|
| DE | 102006058328 | 5/2008 |
| DE | 20 2010 004061 | 7/2010 |

OTHER PUBLICATIONS

International Search Report. International Patent Application No. PCT/EP2011/066767 Jul. 2011. European Patent Office. 3 pgs.
Office Action. Germany Patent Office. Application No. 10 2010 027 901.3-34 Mar. 31, 2011. 3 pgs.

* cited by examiner

SUPPLY MODULE AND DRIVE MODULE

BACKGROUND

The present invention relates to a supply module for supplying electric current to a drive module, the supply module comprising a first connecting contact and a second connecting contact, the first connecting contact being configured to connect the supply module to the drive module, and the second connecting contact being configured to provide a connection to a power supply. The present invention further relates to a drive module with such a supply module.

Drive systems comprising a drive module, a supply module and a connection to a control unit are known in the art, the supply module being connected to the drive module and to a power supply. Thereby, the drive module controls an engine and provides it with a connection to the power supply.

According to the "UL Standard for Safety for Industrial Control Panels, UL 508A", it is required that drive modules each comprise a separate fuse element in order to protect them against exceeding a predefined maximum current value. Usually, the fuse elements are arranged within the drive module, the fuse elements being adjusted to an engine connected to the drive module. However, this requires a corresponding structural adjustment of the drive module to the demands of the UL standard, as well as to the engine connected to the drive module.

SUMMARY

The present invention generally relates to an improved supply module and an improved drive module, which may have a simplified safeguarding.

One embodiment of the invention provides a supply module for supplying electric current to a drive module. The supply module comprises a first connecting contact and a second connecting contact. The first connecting contact is configured to connect the supply module to the drive module. The second connecting contact is configured to provide a connection to a power supply. At least one fuse element is arranged between the first connecting contact and the second connecting contact, the fuse element being connected to the two connecting contacts and being configured to limit a current flow between the first connecting contact and the second connecting contact.

Another embodiment of the invention provides a supply module for a drive module for supplying electric current to a drive module. The supply module comprises a housing with a first backside connecting contact and a second frontside connecting contact. The first connecting contact is arranged on a first circuit board configured to connect the supply module to the drive module. The second connecting contact is arranged on a second circuit board and configured to provide a connection to a power supply. The supply module further comprises at least one fuse element which is arranged between the first circuit board and the second circuit board in the housing and which is connected to the first connecting contact and to the second connecting contact. The fuse element is configured to limit a current flow between the first connecting contact and the second connecting contact. The second connecting contact comprises a contact bridge and a contact element. Further a contact slide is provided which is configured to laterally slide the contact bridge out of the housing in order to laterally engage in a housing of a further supply module by means of the contact bridge and to contact a contact element of the further supply module. The housing comprises a cap which is arranged in an area of the fuse element on one side of the housing, wherein the cap may be opened from the outside and closed again and covers the fuse element.

Another embodiment of the invention provides a drive module with a supply module. The supply module comprises a first connecting contact and a second connecting contact. The first connecting contact is configured to connect the supply module to the drive module. The second connecting contact is configured to provide a connection to a power supply. At least one fuse element is arranged between the first connecting contact and the second connecting contact, the fuse element being connected to the two connecting contacts and being configured to limit a current flow between the first connecting contact and the second connecting contact.

DETAILED DESCRIPTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Also, signal names used below are exemplary names, indicative of signals used to perform various functions in a given supply module. In some cases, the relative signals may vary from module to module. Furthermore, the circuits and devices described below and depicted in the figures are merely exemplary of embodiments of the invention.

Figure 1:
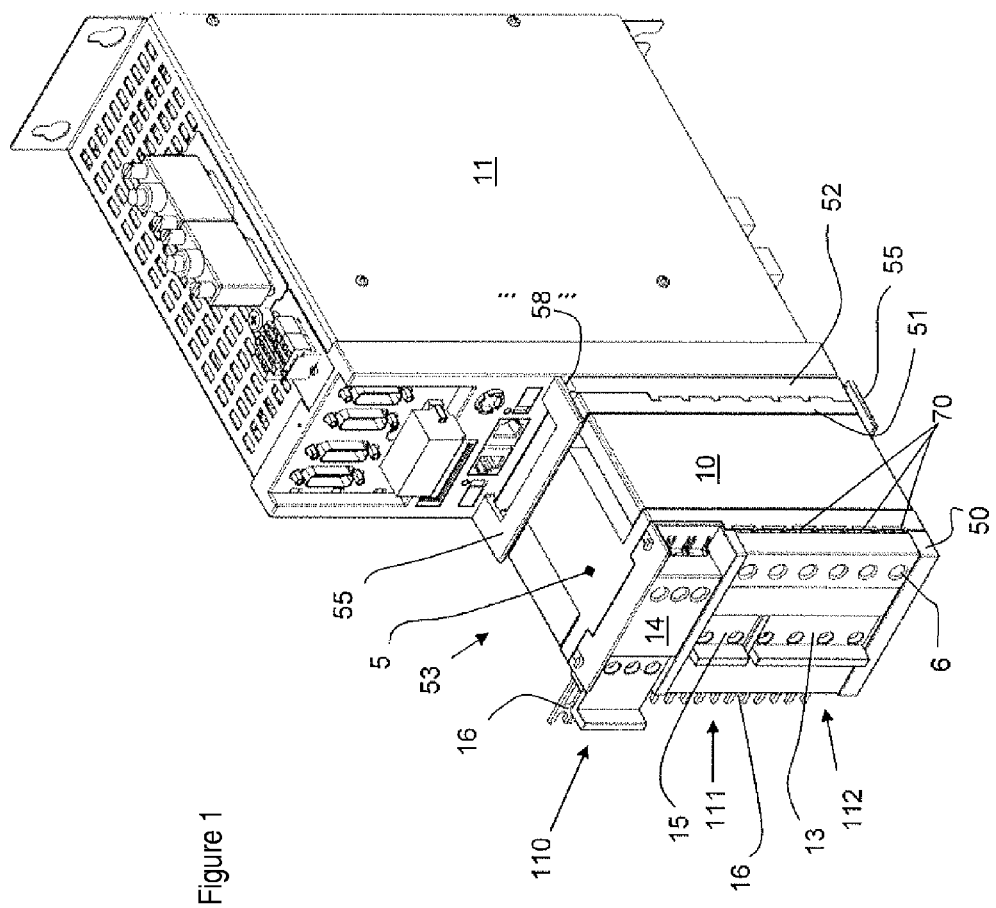
FIG. 1 shows a perspective view of a first supply module arranged at a drive module in an assembled state.

FIG. 1 shows a perspective view of a first supply module 10 arranged at a drive module 11 in an assembled state. The drive module 11 is configured as a servo amplifier and serves to control a non-depicted servomotor. The supply module 10 is arranged at a front side of the drive module 11. The first supply module 10 comprises a housing 53, at the front side of which several contact slides 13, 14, 15 are arranged which form the connecting contacts 110, 111, 112 of the first supply module. The contact slides 13, 14, 15 comprise contact bridges 16, wherein the contact slides 13, 14, 15 may be slid left or right on the front side of the first supply module 10. Furthermore, the contact slides 13, 14, 15 comprise several bolting apertures 6. The housing 53 of the first supply module 10 is in a three-part configuration and comprises a first housing part 50 at which the contact slides 13, 14, 15 are arranged, as well as a second housing part 51 and a third housing part 52, the second housing part 51 being arranged between the first housing part 50 and the third housing part 52.

In the right-hand side area of the housing 53, in the transitional area of the first housing part 50 and the second housing part 51, the housing 53 further comprises a plurality of contact apertures 70 which are configured to hold the contact bridges 16 of a further supply module. On the backside, the housing 53 comprises a locking element 55 which engages with a catch 58 of the drive module 11.

Figure 2:
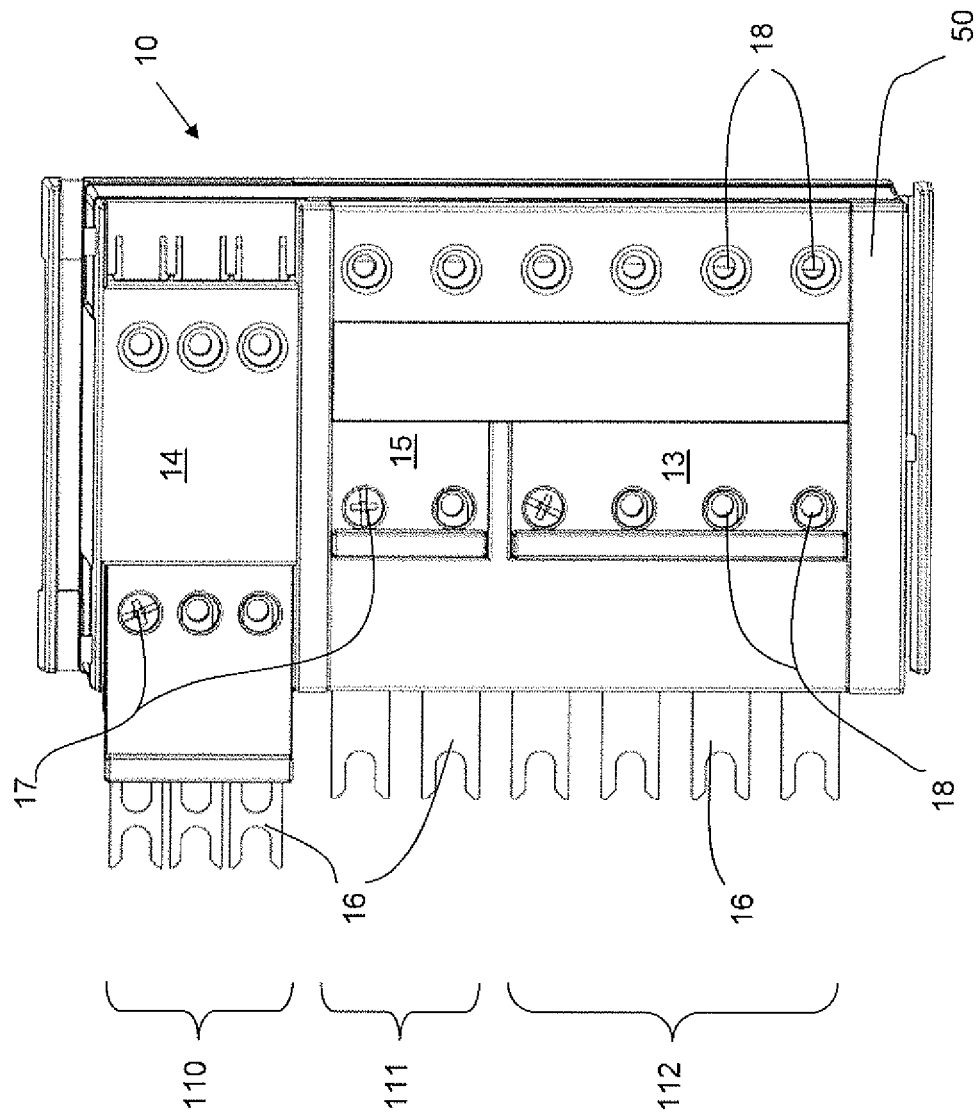
FIG. 2 is a front view of a first supply module.

FIG. 2 shows a front view of the first supply module 10. The contact slides 13, 14, 15 are depicted in an extended, actuated state in which the contact bridges 16 protrude from the housing 53 of the first supply module 10 in order to engage with a further supply module and to contact contacting elements 19 of a further supply module. In order to assemble the first supply module 10 at the drive module 11, the contact slides 13, 14, 15 are slid to the right so that the contact bridges 16 are inserted into the housing 53 of the first supply module 10. If the supply module 10 is assembled in conjunction with a plurality of drive modules and further supply modules, the supply module 10 is mounted onto the drive module 11, the locking elements 55 thus engaging with catches 58 of the drive module 11 and reversibly fastening the first supply module 10 to the drive module 11. In order to guarantee a reliable contact with the further supply modules, the contact slides 13, 14, 15 are slid to the left after the first supply module 10 has engaged with the drive module 11, so that the contact bridges 16 extend into a further supply module, where they engage with non-depicted contact elements.

Figure 3:
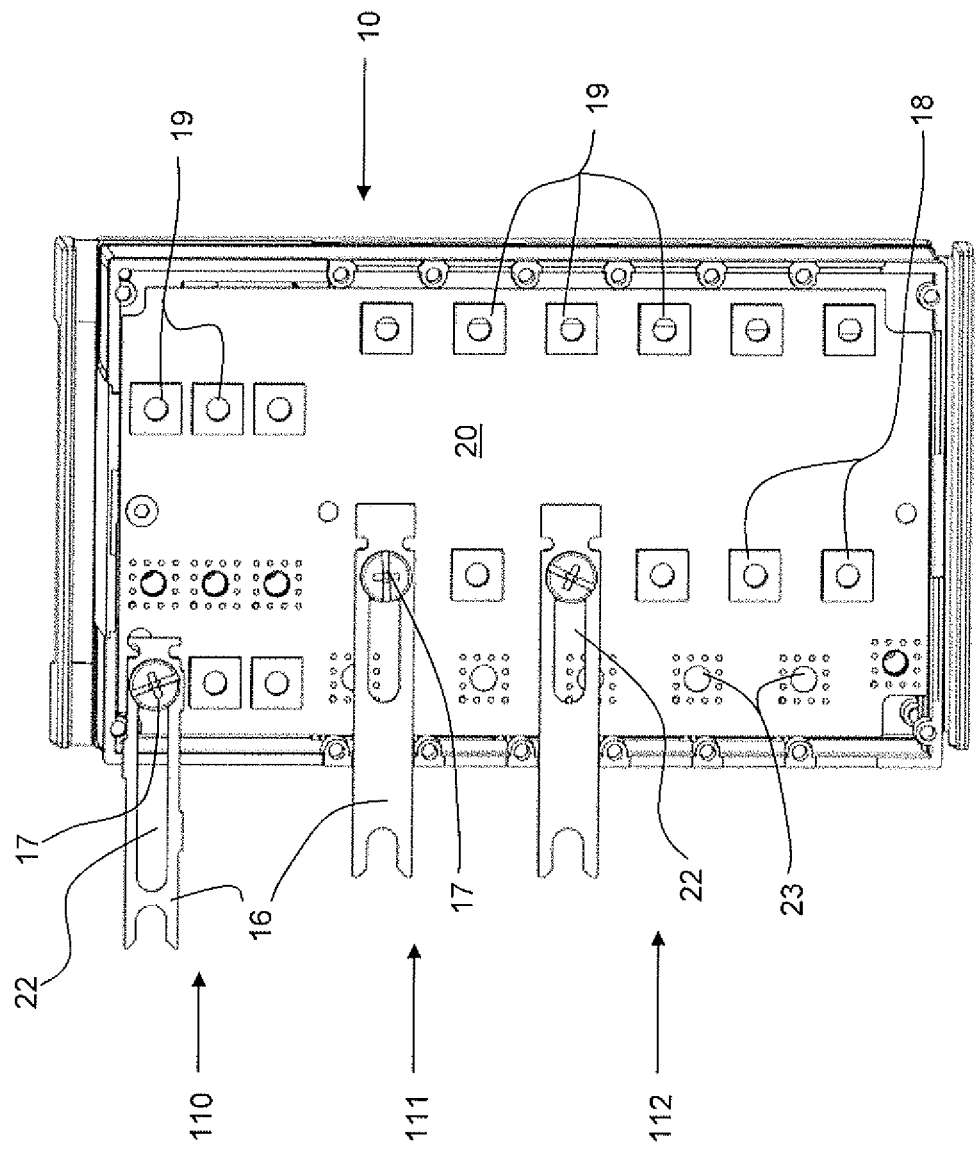
FIG. 3 depicts a front view of the first supply module with a disassembled first housing part.

FIG. 3 depicts the front view of the first supply module 10 shown in FIG. 2 without the first housing part 50 which carries the contact slides 13, 14, 15. On a first circuit board 20 which is arranged in parallel to the drawing plane, several bolting apertures 18 comprising fastening bolts 17 are arranged. The contact bridges 16 of which only a part is depicted here, each comprise an elongated hole 22 which is arranged in the direction of the longitudinal axis of the contact bridges 16. In order to fasten the contact bridges 16, the fastening bolts 17 engage through the elongated holes 22 of the contact bridges 16 and fix them to the first circuit board 20. The contact bridges 16 may be slid by means of the contact slides 13, 14, 15, whereby the fastening bolt 17 is loosened in the elongated hole 22 for sliding. In order to provide a vibration-resistant contacting by means of the contact slides 13, 14, 15, the fastening bolt 17 is pulled tight through the bolting apertures 6 so that the contact bridge 16 is fixed reliably. This allows for a fast assembly and disassembly of the first supply module 10.

The first circuit board 20 further comprises attachment points 23 which serve to connect the first circuit board 20 to a second circuit board 21 arranged behind the first circuit board 20. On the right-hand side of the first circuit board 20, several contact elements 19 are arranged with which the contact bridges 16 of a further supply module may engage in order to provide a connection to the further supply module.

Figure 4:
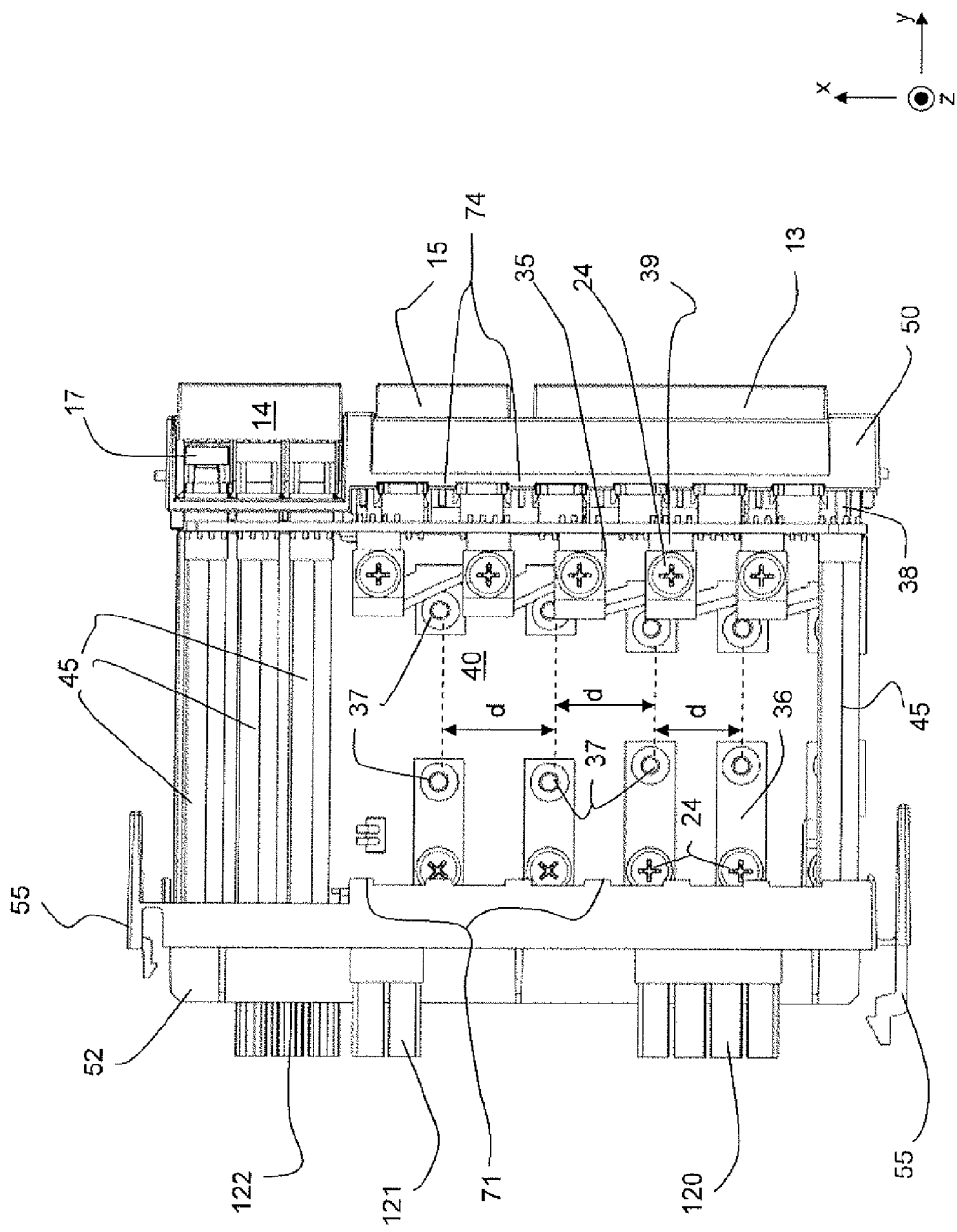
FIG. 4 shows a lateral view of the first supply module.

FIG. 4 depicts a lateral view of the first supply module 10 in a partially assembled state. In the housing 53 of the first supply module 10, the first circuit board 20 is arranged opposite at the first housing part 50 and a second circuit board 21 is arranged in parallel to the first circuit board 20 at the third housing part 52. In FIG. 4, the second circuit board 21 is thereby concealed by the third housing part 52. The circuit boards 20, 21 are arranged in parallel to the front and backside of the housing 53 and fixed within the housing 53 by means of fastening elements 38. A plate 40 is arranged perpendicularly with regard to the two circuit boards 20, 21, the plate 40 comprising electrically insulating material and serving to fasten the bus bar 35, 36 as well as the fuse elements arranged on the opposite side of the plate 40 and depicted in FIG. 5.

A first bus bar 35 arranged at the first circuit board 20 has a Z-shape and is by one of its ends fixed to an angle element 39 by means of a fastening screw 24. At its other end, the first bus bar 35 comprises a receptacle 37. The Z-shaped configuration of the first bus bar 35 serves to determine a safety distance d between the bus bars 35, 36 and the fuse elements 30. In this manner, it is guaranteed that the required safety distance d for air is maintained in accordance with a voltage applied to the fuse element 30 and with the insulation of the fuse element 30. Thereby, due to the Z-shaped configuration, the receptacle 37 for fixing the fuse element 30 may be structurally determined in its height (x-direction) at the plate 40 so that the available space in the housing 53 is utilized in the best possible way. Moreover, due to the Z-shaped configuration of the first bus bar 35, the depth of the available space in the z-direction of the housing 53 is utilized in the best possible way in order to safeguard a narrow configuration of the supply module 10.

Figure 5:
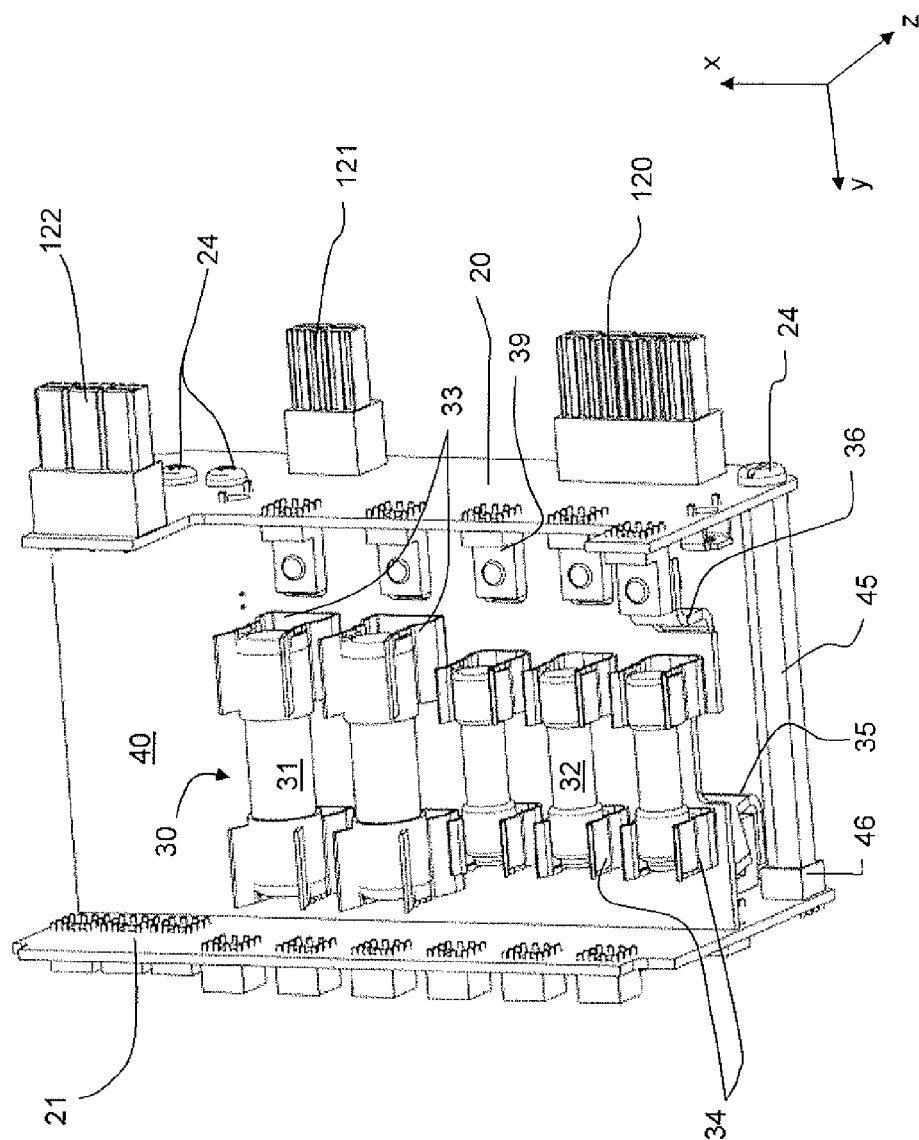
FIG. 5 is a perspective view of the first supply module.
Figure 6:
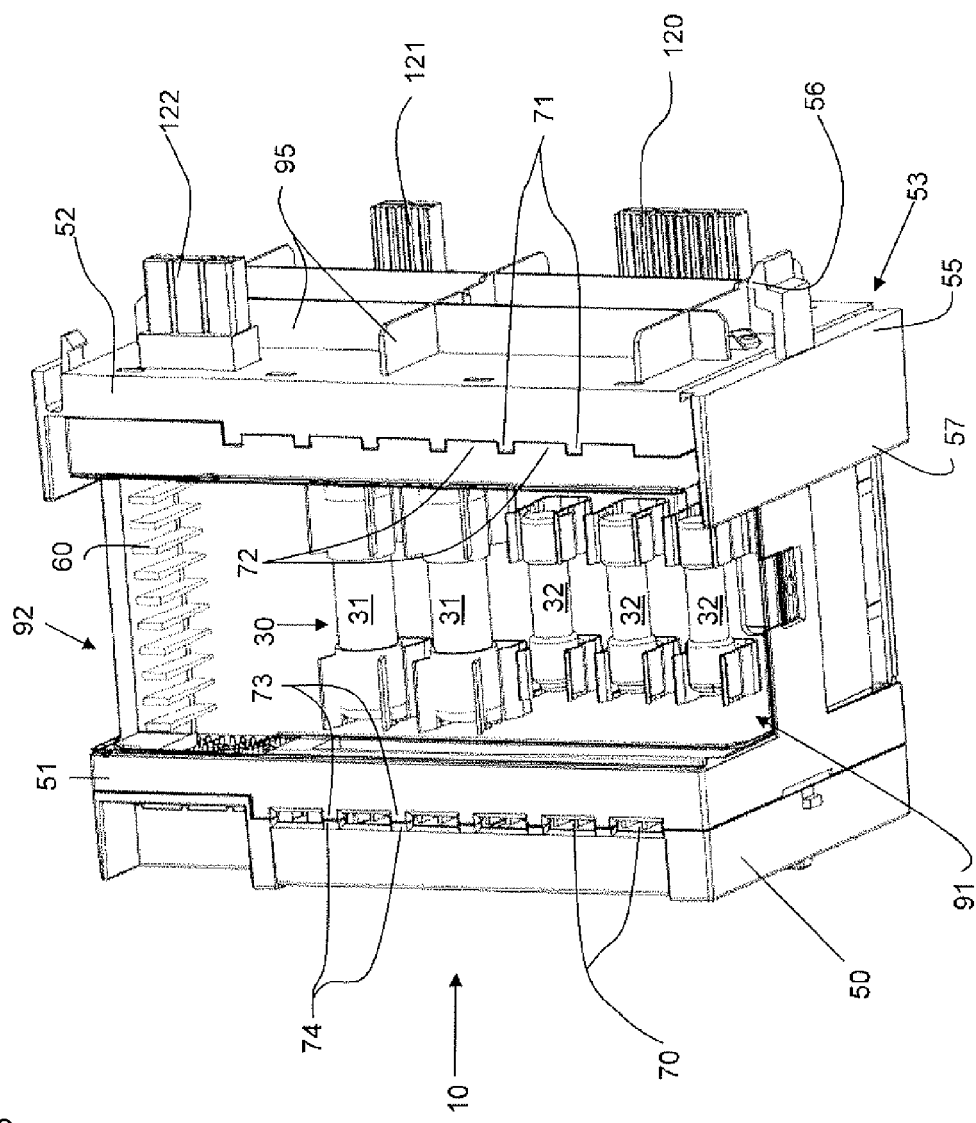
FIG. 6 is a perspective view of the first supply module in a partially assembled state.

A second bus bar 36 is configured in the shape of a plate and connects the output side of the fuse elements 30 and the receptacle 37 to the second circuit board 21. The second bus bars 36 are fixed to the second circuit board 21 by means of the fastening screws 24 and (non-depicted) angle elements. On the backside of the plate 40, the fuse elements 30 are arranged as shown in FIGS. 5 and 6. The receptacle 37 is connected to the fuse element 30 in an electrically conductive manner via the plate 40. Connecting contacts 120, 121, 122 are provided at the second circuit board 21 in order to connect the first supply module 10 to the drive module 11 in an assembled state, as shown in FIG. 1. In this context, a first connecting contact 120 provides the mains voltage tapped via the first contact slide 13. A second connecting contact 121 serves to provide an energy exchange between the individual drive modules 11 for a DC link system. A connection for the second connecting contact 121 to further supply modules is provided via the third contact slide 15. A third connecting contact 122 is connected to the second contact slide 14 by means of connecting bolts 45 and provides an auxiliary voltage in the form of a direct voltage in order to supply the drive module 11 or in order to control e.g. a brake, a thermostat relay and/or digital inputs and outputs. Due to the low control currents therein, a safeguarding according to the UL standard is not provided. Furthermore, the third connecting contact 122 and the second contact slide 14 are connected in a low-resistive manner by means of the connecting bolt 45.

FIG. 5 shows a perspective view of the first supply module 10, depicting a backside of FIG. 4. The fuse elements 30 are arranged on the plate 40. Depending on the amount of current to be protected, the fuse elements 30 have differing sizes. As a result, the first fuse bodies 32 arranged below in order to protect the first connecting contact 120 are configured smaller than the second fuse bodies 31 for protecting the DC link system, which are arranged above the first fuse bodies. The corresponding fuse holders 33, 34 have been configured and fixed to the plate 40 in accordance with the size of the fuse bodies 31, 32.

The fuse holders 33, 34 are distanced from each other on the plate 40 in the x-direction in such a way that a voltage flashover to the fuse holders 33, 34 arranged beside is prevented and a safety distance d required for the applied voltages is adhered to. The fuse holders 33, 34 engage with the receptacle 37 on the backside and are thereby connected to the bus bars 35, 36. Instead of the depicted fuses, electronic fuses, auto-reset fuses, motor overload switches or circuit breakers are conceivable.

The fastening bolts 45 are fixed to the first circuit board 20 by means of fastening screws 24. At the end of the fastening bolt 45 opposite to the fastening screw 24, the fastening bolt 45 comprises a thread which, in an assembled state, engages with a bolt connection 46 which is arranged on the inside at the second circuit board 21. In this manner, the fastening bolt 45 may be easily mounted during assembly, a reliable current transmission from the first circuit board 20 to the second circuit board 21 being furthermore guaranteed. The fastening bolts 45 arranged above and below in the housing further prop up the two circuit boards 20, 21 against each other and reliably fix them within the housing 53. Furthermore, the plate 40 is connected to the circuit boards 20, 21 in order to more efficiently support the circuit boards 20, 21.

Moreover, the first bus bar 35 is, in addition to the Z-shaped configuration, configured in an S-shape in order to dispose the arrangement of the fuse holders 33, 34 on the plate 40 in the y-direction in a favourable manner with regard to space. In this context, the position of the plate in the y-direction may be structurally adjusted depending on the configuration of the S-shape of the bus bar 35.

FIG. 6 shows a perspective view of the supply module 10 in a partially assembled state. The arrangement of the circuit boards 20, 21 corresponds to the embodiment of FIG. 5 of the first supply module 10. In this context, the housing 53 of the supply module 10 is open in the area of the fuse elements 30. The third housing part 52 comprises a first pinnacle-shaped area 72 which faces the second housing part 51. The second housing part 51 which is arranged between the first housing part 50 and the third housing part 52 comprises a second pinnacle-shaped area 71 which faces the first pinnacle-shaped area 72 of the third housing part 52. The second pinnacle-shaped area 71 is configured in such a way that the second pinnacle-shaped area 71 engages with the gaps of the first pinnacle-shaped area 72, the latter covering the structure of the first pinnacle-shaped area 72 in such a way that the housing 53 is in this area sealed off against its surroundings.

Between the first housing part 50 and the second housing part 51, contact apertures 70 are arranged through which the contact bridges 16 of a further supply module may be guided in an assembled state. The contact apertures 70 are formed by a third pinnacle-shaped area 73 arranged at the second housing part 51 and facing the first housing part 50 as well as by a fourth pinnacle-shaped area 74 of the first housing part 50 facing the second housing part 51. By forming the housing parts 50, 51, 52 with the pinnacle-shaped areas 71, 72, 73, 74, the housing parts 50, 51, 52 may be used for forming a supply module 10 comprising fuse elements 30. However, the configuration with the pinnacle-shaped areas 71, 74 also allows for the first housing part 50 to be arrangable at the third housing part 52. In this case, however, the housing parts 50, 52 do not admit any fuse elements 30 and form a further supply module comprising the contact slides 13, 14, 15 which provides a power supply for the drive module 11 without safeguarding. Thereby, the first pinnacle-shaped area 71 and the fourth pinnacle-shaped area 74 form the contact apertures 70.

Above the fuse elements 30, a ventilation grid 60 is arranged at the second housing 51 which prevents an access to the fuse elements 30 from above through a first aperture 92 and further allows for the housing 53 to be ventilated by cooling air. The cooling air thereby enters the housing 53 through a second aperture 91 and leaves the housing 53 on the top through the ventilation grid 60. In this manner, a cooling of the fuse elements 30 may be guaranteed by natural convection. It is alternatively conceivable that the ventilation grid 60 is arranged on the inside at a cap 80 as shown in FIG. 7.

The third housing part 52 further comprises laterally arranged locking elements 55 with a latch cam 56 and a locking connector 57. The latch cam 56 is approximately aligned in the direction of the drive module 11 and grips around a catch 58 depicted in FIG. 1. The latch cam 56 may be released by the locking connector 57 in order to be able to remove the housing 53 of the supply module 10 from the drive module 11. In this manner, the housing 53 as well as a supply module only consisting of the first and third housing part 50, 52 may be reversibly fixed to the drive module 11.

The surface of the third housing part 52 facing the drive module 11 comprises a plurality of reinforcing ribs 95 which guarantee a rigid connection of the third housing part 52, thus safeguarding a rigid connection of the supply module 10.

Figure 7:
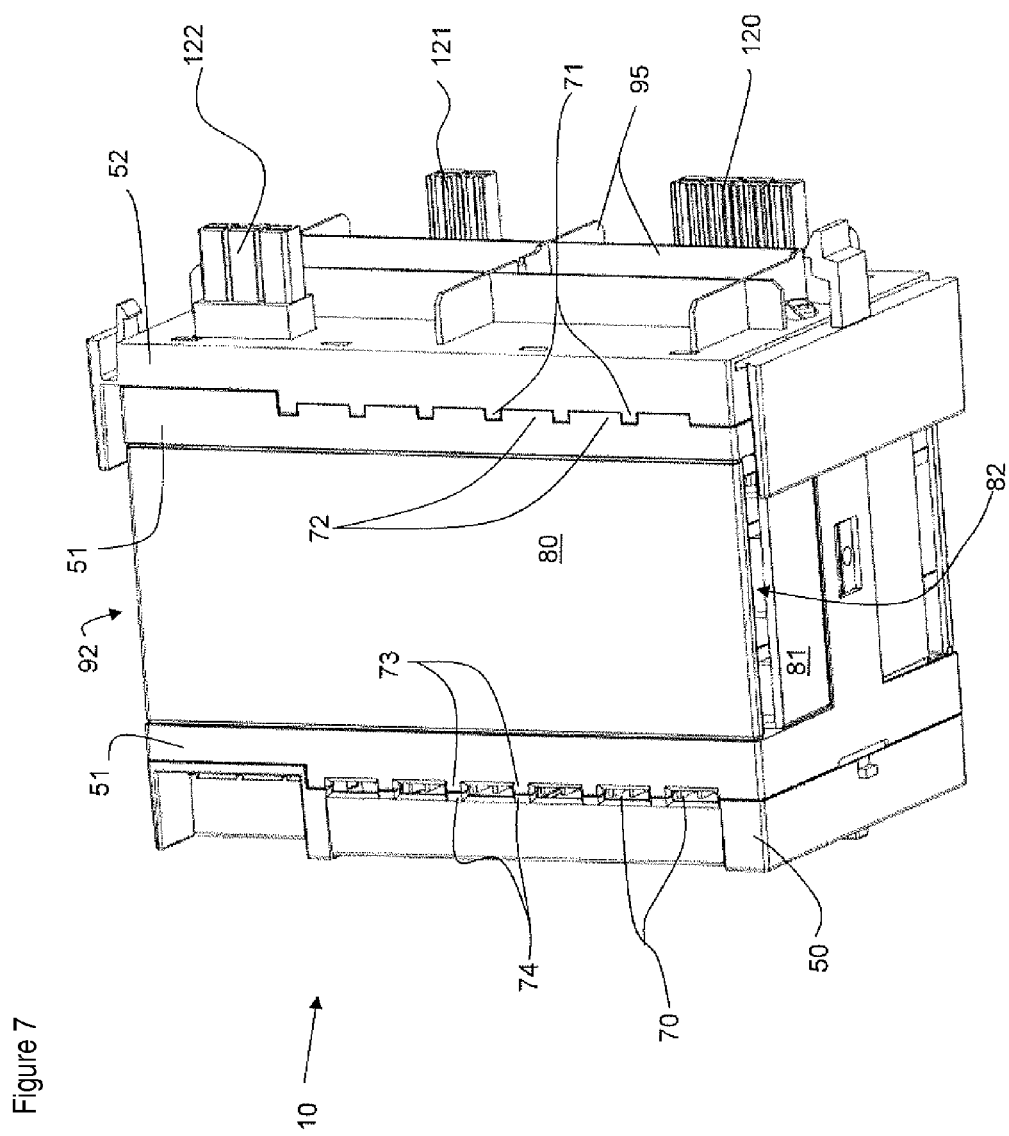
FIG. 7 depicts a perspective view of the first supply module.

FIG. 7 shows a perspective view of the supply module 10 in an assembled state. Below the fuse elements 30 depicted in FIG. 6, the housing 53 is sealed by means of a cover 81, thus preventing the current-carrying fuse elements 30 from being touched from below. In parallel to the plate 40, a cap 80 is arranged laterally at the housing 53, covering the fuse elements 30 shown in FIG. 5 and FIG. 6. Between the cover 81 and the cap 80, a gap 82 is arranged which allows for the warmed-up cooling air to stream out of the housing 53. The lateral arrangement of the cap 80 at the second housing part 51 allows for the safe covering of the fuse elements 30 in the current-carrying state. The cap 80 may be re-sealed and opened from the outside in order to be able to exchange defect fuse elements 30. If several supply modules 10 are mounted side-by-side at various drive modules 11, defect fuse elements 30 may not be exchanged until the supply module 10 is separated from further supply modules and removed from the drive module 11. In this manner, an access to the fuse elements 30 is provided, wherein the fuse elements 30 are off current due to the removal of the supply module 10 from the drive module 11 and from further supply modules 10.

Figure 8:
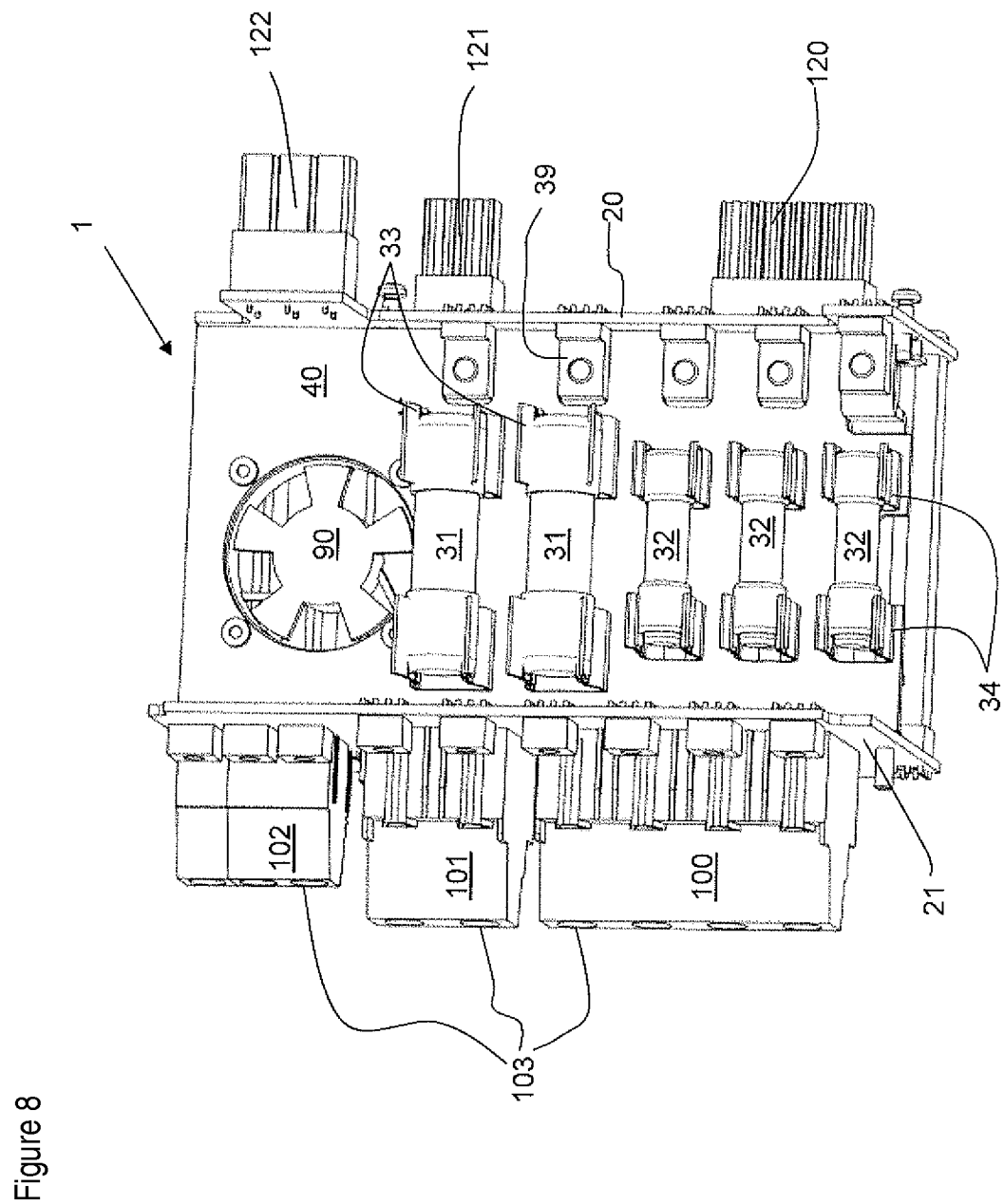
FIG. 8 shows a perspective view of a second supply module.

FIG. 8 depicts a perspective view of a second supply module 1. Compared to the first supply module 10 of FIGS. 1 to 7, the second supply module 1 comprises alternative connecting contacts 100, 101, 102 instead of the connecting contacts 110, 111, 112 configured as contact slides 13, 14, 15, the connecting contacts 100, 101, 102 serving to connect the second supply module 1 with (non-depicted) connecting lines. The connecting contacts 100, 101, 102 comprise several connecting apertures 103 into which a counterpart of the connecting contact 100, 101, 102 of the connecting conductor respectively engages, establishing an electrically conductive connection to the respective contact of the connecting contact 100, 101, 102.

The second supply module 1 further comprises a ventilator 90 arranged above the fuse elements 30 in order to supply the fuse elements 30 with sufficient cooling air. For this purpose, the ventilator 90 absorbs cooling air from below the second supply module 1. The absorbed air is directed past the fuse elements 30 and leaves the housing 53 as warmed-up cooling air on the top through the first aperture 92, as shown in FIG. 1 to FIG. 7.

The second supply module 1 is configured to establish an electric connection with the first supply module 10 by means of the contact bridges 16. Furthermore, the connecting contacts 120, 121, 122 provide a connection to the drive module 11 at the surface facing the drive module 11. The fuse elements 30 of the second supply module 1 are connected via bus bars 35, 36 in the same way as the fuse elements 30 shown in FIGS. 1 to 7, and they limit a flow of current from the connecting contacts 100, 101, 102 on the input side, which are arranged on the front side of the second supply module 1, to the backside connecting contacts 120, 121, 122 on the output side of the drive module 11.

It is, of course, also possible to arrange the ventilator 90 of FIG. 8 within a first supply module 10, if additional cooling of the components, particularly of the fuse elements, is required.

In summary, an improved supply module may be provided by a supply module comprising a first connecting contact and a second connecting contact, the first connecting contact connecting the supply module to the drive module and the second connecting contact providing a connection to a power supply. A fuse element is arranged between the first connecting contact and the second connecting contact, the fuse element being connected to both connecting contacts and limiting a current flow between the first connecting contact and the second connecting contact.

In this manner, it is guaranteed that a drive module is reliably protected against over-currents without requiring any structural redesign. Furthermore, in this manner, the drive module may be modularly protected by the fuse element according to several different standards.

According to an embodiment, the first connecting contact is arranged on a first circuit board and the second connecting contact is arranged on a second circuit board, the fuse element being arranged between the first circuit board and the second circuit board and being connected to the circuit boards. In this manner, the fuse elements may be fixed within the supply module in a simple manner.

In a further embodiment, the second connecting contact comprises a contact slide having a contact slide and a contact bridge operated by the contact slide and engaging with a further supply module in order to provide an electrical connection to the further supply module. In this manner, a connection from the supply module to a further supply module may be established simply and quickly, which is particularly advantageous when combining a plurality of drive modules to result in a multi-axis drive system.

In a further embodiment, the fuse element is connected to a bus bar which is connected to one of the two circuit boards and provides an electric connection from the fuse element to one of the two circuit boards. By means of the bus bar, high currents may safely be transmitted from the circuit board to the fuse element.

In a further embodiment, the bus bar is Z-shaped and connects a plate to one of the two circuit boards. In this manner, the spatial arrangement of the plate within a housing of the supply module may be determined in a simple manner.

In a further embodiment, the fuse element comprises a fuse body and a fuse holder, the fuse holder being fixed to the plate and connected to the bus bar, and the fuse holder fixing the fuse body within the housing of the supply module. In this manner, a vibration-resistant fixing of the fuse body within the supply module may be provided.

In a further embodiment, the first circuit board is connected to the second circuit board by means of a connecting bolt. In this manner, the two circuit boards may easily be propped up against each other and a connection without fuse element may be provided from the first connecting contact to the second connecting contact.

In a further embodiment, the housing of the supply module comprises a first, a second and a third housing part, the first housing part being connectable to the second as well as to the third housing part. In this manner, it is guaranteed that the three housing parts may in combination form a first housing, whereby a second housing may be formed by means of the first housing part and the third housing part, the second housing being configured as a supply module without fuse element.

In a further embodiment, the second housing part is arranged between the first and the third housing part, the first housing part comprising a first pinnacle-shaped area facing the second housing part. The second housing part comprises a second pinnacle-shaped area which is configured in such a way that the second pinnacle-shaped area engages with the first pinnacle-shaped area. In this manner, it is guaranteed that openings which are formed by means of the first pinnacle-shaped area of the first housing part and the third housing part are reliably closed in the case of the supply module comprising three housing parts.

In a further embodiment, the housing comprises a cap which is laterally arranged at the housing in an area of the fuse element, wherein the cap may be opened and closed again from the outside and covers the fuse element. In this manner, it is guaranteed that the current-carrying fuses are reliably protected against any impact from outside, whereby the lateral arrangement of the cap at the housing forces the installing technician to separate the supply module from the drive module in order to be able to exchange the fuse element. In this manner, it may be reliably guaranteed that the fuse element is off current during the exchange.

In a further embodiment, a ventilator is arranged within the supply module, the ventilator being configured to convey cooling air through the supply module. In this manner, an operating temperature of the fuse elements may be safeguarded by a forced cooling by means of the ventilator.

While the foregoing is directed to embodiments of the invention, other and further embodiments of this invention may be devised without departing from the basic scope of the invention, the scope of the present invention being determined by the claims that follow.

The invention claimed is:

1. A supply module for supplying electric current to a drive module, the supply module comprising a first connecting contact and a second connecting contact, the first connecting contact being configured to connect the supply module to the drive module, and the second connecting contact being configured to provide a connection to a power supply, wherein at least one fuse element is arranged between the first connecting contact and the second connecting contact, the fuse element being connected to the two connecting contacts and being configured to limit a current flow between the first connecting contact and the second connecting contact;

wherein the first connecting contact is arranged on a first circuit board and the second connecting contact is arranged at a second circuit board, the fuse element which is connected to the circuit boards being arranged between the first and the second circuit board;

wherein the fuse element is connected to a bus bar which is connected to one of the two circuit boards and provides an electric connection to one of the two circuit boards;

wherein the bus bar has a Z-shaped configuration and is configured to connect a plate to one of the two circuit boards; and wherein the fuse element comprises a fuse body and a fuse holder, the fuse holder being arranged at the plate and connected to the bus bar and the fuse holder fixing the fuse body in the housing of the supply module.

2. The supply module according to claim 1, wherein the second connecting contact comprises a contact slide comprising a contact slide and a contact bridge which is configured to be operated by the contact slide and to engage with a further supply module and to provide an electric connection with the further supply module.

3. The supply module according to claim 1, wherein the first circuit board is connected to the second circuit board by means of a connecting bolt.

4. The supply module according to claim 1, wherein the housing of the supply module comprises a first, a second and a third housing part, the first housing part being connectable to the second housing part as well as to the third housing part.

5. The supply module according to claim 4, wherein the second housing part is arranged between the first and the third housing part, the first housing part comprising a first pinnacle-shaped area facing the second housing part, and the second housing part comprising a second pinnacle-shaped area being configured in such a way that the second pinnacle-shaped area engages with the first pinnacle-shaped area.

6. The supply module according to claim 1, wherein the housing comprises a first aperture and a second aperture, the first aperture being arranged on an upper surface of the housing and the second aperture being arranged on a bottom surface of the housing, the apertures being configured to guide a jet of cooling air through the housing.

7. The supply module according to claim 1, wherein the housing comprises a cover which is arranged laterally to the housing in an area of the fuse element, wherein the cover may be opened and closed again from the outside and covers the fuse element.

8. The supply module according to claim 1, wherein a ventilator is arranged in the supply module which is configured to guide cooling air through the supply module.

9. The supply module according to claim 1, wherein the fuse element is configured as a safety fuse or an electronic fuse or an auto-reset fuse or a circuit breaker or a motor overload switch.

10. A supply module for a drive module for supplying electric current to a drive module, the supply module comprising a housing with a first backside connecting contact and a second frontside connecting contact, the first connecting contact being arranged on a first circuit board configured to connect the supply module to the drive module, and the second connecting contact being arranged on a second circuit board and configured to provide a connection to a power supply, and comprising at least one fuse element which is arranged between the first circuit board and the second circuit board in the housing and which is connected to the first connecting contact and to the second connecting contact, the fuse element being configured to limit a current flow between the first connecting contact and the second connecting contact, wherein the second connecting contact comprises a contact bridge and a contact element, a contact slide being provided which is configured to laterally slide the contact bridge out of the housing in order to laterally engage in a housing of a further supply module by means of the contact bridge and to contact a contact element of the further supply module, and in that the housing comprises a cap which is arranged in an area of the fuse element on one side of the housing, wherein the cap may be opened from the outside and closed again and covers the fuse element.

11. The supply module according to claim 10, wherein the fuse element is connected to a bus bar which is connected to one of the two circuit boards and provides an electric connection to one of the two circuit boards.

12. The supply module according to claim 11, wherein the bus bar has a Z-shaped configuration and is configured to connect a plate to one of the two circuit boards.

13. The supply module according to claim 12, wherein the fuse element comprises a fuse body and a fuse holder, the fuse holder being fixed to the plate and connected to the bus bar and the fuse holder fixing the fuse body in the housing of the supply module.

14. The supply module according to claim 10, wherein the first circuit board is connected to the second circuit board by means of a connecting bolt.

15. The supply module according to claim 10, wherein the housing of the supply module comprises a first, a second and a third housing part, the first housing part being connectable to the second housing part as well as to the third housing part.

16. The supply module according to claim 15, wherein the second housing part is arranged between the first and the third housing part, the first housing part comprising a first pinnacle-shaped area facing the second housing part, and the second housing part comprising a second pinnacle-shaped area being configured in such a way that the second pinnacle-shaped area engages with the first pinnacle-shaped area.

17. The supply module according to claim 10, wherein the housing comprises a first aperture and a second aperture, the first aperture being arranged on an upper surface of the housing and the second aperture being arranged on a bottom surface of the housing, the apertures being configured to guide a jet of cooling air through the housing.

18. The supply module according to claim 10, wherein a ventilator is arranged in the supply module which is configured to guide cooling air through the supply module.

19. The supply module according to claim 10, wherein the fuse element is configured as a safety fuse or an electronic fuse or an auto-reset fuse or a circuit breaker or a motor overload switch.

20. A drive module with a supply module for supplying electric current to the drive module, the supply module comprising a housing with a first backside connecting contact and a second frontside connecting contact, the first connecting contact being arranged on a first circuit board configured to connect the supply module to the drive module, and the second connecting contact being arranged on a second circuit board and configured to provide a connection to a power supply, and comprising at least one fuse element which is arranged between the first circuit board and the second circuit board in the housing and which is connected to the first connecting contact and the second connecting contact, the fuse element being connected to the two connecting contacts and being configured to limit a current flow between the first connecting contact and the second connecting contact;

wherein the second connecting contact comprises a contact bridge and a contact element, a contact slide being provided which is configured to laterally slide the contact bridge out of the housing in order to laterally engage in a housing of a further supply module by means of the contact bridge and to contact a contact element of the further supply module, and in that the housing comprises a cap which is arranged in an area of the fuse element on one side of the housing, wherein the cap may be opened from the outside and closed again and covers the fuse element.

* * * * *